United States Patent [19]

Mackintosh et al.

[11] Patent Number: 5,085,728
[45] Date of Patent: Feb. 4, 1992

[54] SYSTEM FOR CONTROLLING CRYSTAL GROWTH APPARATUS AND MELT REPLENISHMENT SYSTEM THEREFOR

[75] Inventors: Brian H. Mackintosh, Concord; Lawrence Eriss, Sudbury, both of Mass.

[73] Assignee: Mobil Solar Energy Corporation, Billerica, Mass.

[21] Appl. No.: 492,886

[22] Filed: Mar. 12, 1990

Related U.S. Application Data

[63] Continuation-in-part of Ser. No. 46,991, May 5, 1987, abandoned.

[51] Int. Cl.$^5$ .............................................. C30B 15/34
[52] U.S. Cl. ................................... 156/601; 156/617.1; 156/DIG. 73; 156/DIG. 98; 156/DIG. 115; 422/222; 422/249
[58] Field of Search ............ 156/601, 617.1, DIG. 73, 156/DIG. 98, DIG. 115; 422/222, 249

[56] References Cited

U.S. PATENT DOCUMENTS

| | | | |
|---|---|---|---|
| 3,934,983 | 1/1976 | Bardsley et al. | 422/249 |
| 3,980,438 | 9/1976 | Castonguay et al. | 422/249 |
| 4,512,954 | 4/1985 | Matsui | 156/601 |
| 4,539,067 | 9/1985 | Washizuka et al. | 156/601 |
| 4,544,528 | 10/1985 | Stormont et al. | 156/DIG.73 |
| 4,660,149 | 4/1987 | Lissalde et al. | 156/601 |

OTHER PUBLICATIONS

"Automatic Czochralski Growth, Growth Parameters Measurements and Process Control"; W. Uelhoff; *Journal of Crystal Growth* 65 (1983) pp. 278–279.

*Primary Examiner*—Robert Kunemund
*Assistant Examiner*—Felisa Garrett
*Attorney, Agent, or Firm*—Pandiscio & Pandiscio

[57] ABSTRACT

A control system for controlling the operation of a system for replenishing the melt in the crucible of an apparatus for growing tubular crystalline bodies of a selected material. The melt replenishment system comprises a container for storing solid particles of said selected material and a dispenser for transporting the particles from the container to the crucible. The control system controls the rate at which the dispenser transports particles from the container to the crucible based on the weight of the solid particles stored in the container, the weight of the crystalline body, and the pressure inside the crystalline body. Additionally, the control system may be adapted to control the temperature of the crucible heater of the apparatus. Compensation is provided by this invention for weight measurement errors that are created by pressure fluctuations within the tubular crystalline body.

16 Claims, 6 Drawing Sheets

SYSTEM FOR CONTROLLING CRYSTAL GROWTH APPARATUS AND MELT REPLENISHMENT SYSTEM THEREFOR

BACKGROUND OF THE INVENTION

This is a continuation-in-part application based on U.S. patent application No. 046,991, filed May 5, 1987, now abandoned in favor of a continuation application, U.S. Ser. No. 07/359,506, filed June 1, 1989, which has issued as U.S. Pat. No. 4,936,947.

This invention pertains to apparatus for growing crystals, and more particularly to control systems for controlling melt replenishment systems for apparatus for growing crystalline bodies from a melt.

Silicon sheet used in the fabrication of semiconductor devices may be derived from the flat sides of tubular crystalline bodies having a polygonal cross-sectional shape, e.g. a hollow octagon- or nonagon-shaped body. The tubular bodies are dissected at their corners to provide a plurality of flat sheets of substantially identical size.

Apparatus of the type described in U.S. Pat. No. 4,544,528 have been used to manufacture hollow crystalline bodies according to the edge-defined, film-fed growth process (the EFG process). Briefly, such apparatus usually comprise a crucible for containing a melt of the material to be grown (e.g., silicon), a capillary die for determining the form and shape of the grown crystal, heater means for heating the crucible and die and controlling the temperature of the die and melt, a seed support assembly for supporting the seed used in growing the crystal, and a pulling mechanism coupled to the seed support assembly for drawing the tubular crystalline body out of the melt.

To produce a commercially-satisfactory silicon substrate and to ensure that the crystal growth process is not prematurely terminated by either detachment from the melt supplied by the die or by freeze-up of the tubular crystalline body, it is essential that the wall thickness of the growing body be closely controlled. In connection with the use of capillary die apparatus of the type disclosed in U.S. Pat. No. 4,544,528, it is well known that the wall thickness of the growing crystalline body varies with the size and shape of the meniscus formed between the top of the die and the bottom of the growing body. Using this relationship between wall thickness and the geometric characteristics of the meniscus, a variety of devices incorporating optical systems, such as those disclosed in U.S. Pat. Nos. 4,239,583, 4,267,151 and 4,318,769, have been developed for controlling the operation of crystal-growing apparatus. These optics-based systems comprise an optical assembly for viewing the height and shape of the meniscus. Using information about the configuration of the meniscus obtained by an optics-based system, an operator can adjust the operation of the crystal-growing apparatus so as to produce a crystalline body having a desired wall thickness.

Certain limitations exist with respect to the use of such optical monitoring systems. First, an operator must continuously monitor the configuration of the meniscus and adjust the operation of the crystal growing apparatus based on what he or she observes. To avoid human error, increase crystal growth rates, and reduce the costs associated with the use of a technician, it is desirable to automate the entire crystal growth operation. Second, with known optical control systems only a relatively small portion of the entire meniscus is observable. The configuration of this small portion is not necessarily representative of the total configuration of the entire meniscus.

With known crystal growing apparatus of the type illustrated in U.S. Pat. No. 4,544,528, it has been difficult and impractical to grow crystalline bodies having a length greater than about 2 meters. This difficulty is caused, in part, by the necessity to exclude air from the interior of the growing tubular crystal body by filling the latter with an inert gas such as argon, and, in part, by the fact that convection currents are generated within the internal volume of the growing body by large temperature differences existing therein.

More specifically, an inert gas, typically argon, is injected into the interior of the growing crystalline body so as to exclude ambient air from the interior of the body. Because an inert gas such as argon is heavier that ambient air, in a crystalline body having a length greater than about 2 meters, the inert gas column inside the body attains sufficient length, (and hence sufficient weight), so that the column tends to sink, thereby permitting ambient air to be drawn into the body through the top end thereof.

When measures are taken to prevent ambient air from entering the crystalline body, such as by capping the top end of the body, the deleterious effects of the convection currents generated within the body increase significantly. When the tube is capped, these convection currents cause pressure fluctuations within the crystalline body which make it difficult to control the operation of the crystal growing apparatus. As a result, growth of crystalline bodies having a uniform wall thickness and lengths greater than about 2 meters is problematic. A significant portion of the total time required to grow a crystalline body is consumed in preparing the crystal growing apparatus for the growth procedure. Consequently, to improve process efficiency it is desirable to grow crystalline bodies having lengths greater than about 2 meters. Growing long hollow crystalline bodies, e.g., bodies with a length greater than 2 meters, cannot be accomplished unless provision is made to replenish the melt in the crucible during growth.

Systems are known for replenishing the melt in crystal growth apparatus of the type disclosed in U.S. Pat. No. 4,544,528. Such a system is described by Taylor et al. in the article entitled "The Current Status of EFG Crystal Growth Technology for Terrestrial Solar Cells," North Holland Publishing Co. (J. Kalejs, T. Surek, and V. Tatarchenko, eds.), Amsterdam, 1987. The Taylor et al. system includes a first weight transducer for measuring the weight of the growing crystalline body, a container for storing solid particles of source material, e.g., silicon particles, a dispenser assembly for selectively feeding source material particles from the container to the crucible in the crystal growth apparatus, a second weight transducer for measuring the weight of the silicon particles in the container, and a controller for combining the outputs of the first and second weight transducers so as to generate a difference signal. The controller compares the difference signal with a predetermined setpoint and based on this comparison, the controller sends a control signal to the dispenser assembly so as to cause the latter to dispense a selected quantity of silicon particles into the crucible during a given time interval.

Melt replenishment systems of the type disclosed by Taylor et al. suffer from the pressure fluctuation problems described above with respect to known crystal growth apparatus. Specifically, convection currents in the growing crystalline body can momentarily lift that body slightly, thereby causing the first weight transducer (which measures the weight of the growing crystalline body) to provide an output signal which is not representative of the true weight of the body. Inasmuch as this output signal is used in generating the control signal provided to the silicon dispenser assembly, an erroneous control signal may frequently be provided to the dispenser assembly. As a result, the latter may dispense too many or too few silicon particles during a given time interval, which in turn can lead to production of crystalline bodies having less than optimal characteristics or, in extreme cases, to termination of the crystal growth process due to an improper rate of melt replenishment.

OBJECTS AND SUMMARY OF THE INVENTION

One object of the present invention is to overcome the foregoing disadvantages associated with known control systems for controlling mechanisms for replenishing the melt in apparatus for growing tubular crystals.

Another object of the invention is to provide an improved system for controlling melt replenishment in an apparatus for growing a tubular crystalline body.

Yet another object of the present invention is to provide an improved control system for controlling the operation of (1) an apparatus for growing tubular crystalline bodies and (2) a mechanism for replenishing the melt in the apparatus.

A further object of the invention is to provide an improved control system for controlling the operation of a mechanism for replenishing the melt in an apparatus for growing tubular crystalline bodies based on information provided by sensors regarding the weight of the crystalline body and the pressure in the interior of the crystalline body.

These and other objects of the invention are achieved by providing a crystal growing apparatus having a control system which compensates for pressure fluctuations in a growing hollow crystalline body. In its preferred embodiment, the control system comprises a pressure sensor for measuring the pressure in the interior of a tubular crystalline silicon body, a weight sensor for measuring the combined weight of the tubular silicon body and the seed holder assembly from which the body is supported, a length sensor for measuring the length of the tubular body, a true weight circuit coupled to the pressure and weight sensors for calculating the true weight of the tubular body, and a controller coupled so as to respond to the information provided by the length sensor and the true weight circuit.

The foregoing control system is used to control a melt replenishment system that feeds additional source material in particle form (e.g., silicon particle) to the melt-supporting crucible of the crystal growing apparatus. The melt replenishment system comprises container or reservoir means for storing a supply of source material, electrically controlled dispenser means for dispensing source material in precise quantities from said container means, a feeder mechanism arranged to receive source material from said dispensing means and transport said received source material to said crucible, weighing means for measuring the weight of source material stored in said container means and producing a signal representative of that weight, and means for applying the signal output of said weighing means to said controller. The controller in turn combines the signal output of the true weight circuit, and the weighing means to produce a control signal that is used to control operation of the dispenser means.

Depending on its construction, the melt replenishment system may be operated in a continuous mode or an intermittent or discontinuous mode. When the melt replenishment system is operated in a continuous mode, the control signal is generated so as to contain feed rate information which controls the rate at which the dispenser dispenses silicon particles. When the melt replenishment system is operated in a discontinuous mode, the control signal triggers the dispenser intermittently for a fixed time period, whereby the latter is caused to dispense a fixed quantity of silicon particles each time it is triggered.

Additionally, the control system may be used to control the operation of the heater means of the crystal growing apparatus. By using the signal output of the control system to control the heat output of the heater means, it is possible to control the configuration of the meniscus extending between the growing crystalline body and the EFG die, and thereby (1) control the wall thickness of the growing crystalline body and (2) assure continuous growth so that relatively long bodies (i.e., six meters or more) may be grown.

BRIEF DESCRIPTION OF THE DRAWINGS

For a fuller understanding of the nature and objects of the present invention, reference should be made to the following detailed description taken in combination with the accompanying drawings wherein.

DETAILED DESCRIPTION OF THE INVENTION

Figure 1:
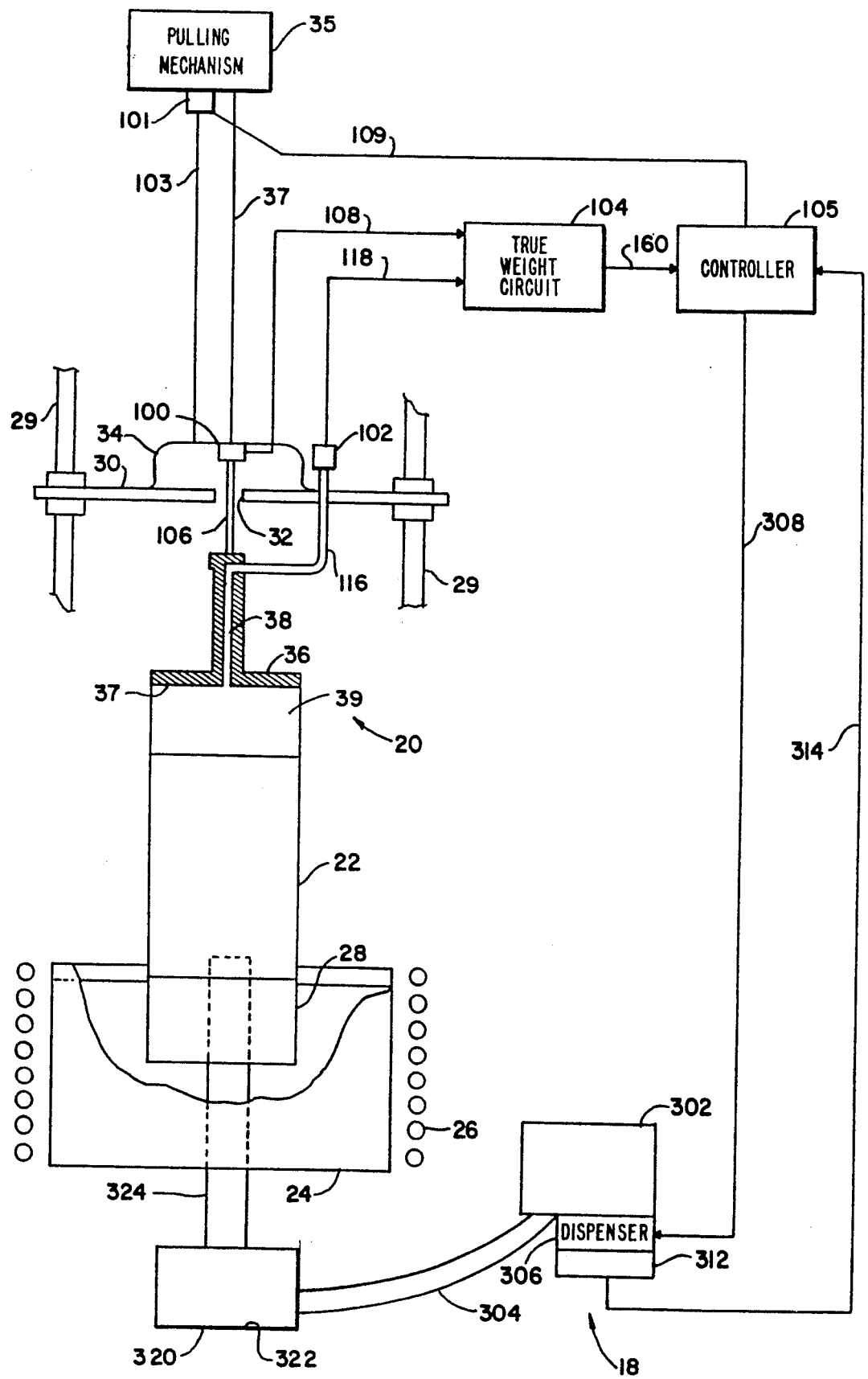
FIG. 1 is a schematic illustration, partly in section, of the preferred embodiment of the present invention.

Referring to FIG. 1, the present invention comprises a control system for controlling (1) the operation of a system 18 for replenishing the melt in an apparatus 20 for growing tubular crystalline bodies 22 of semiconductor materials and (2) the crucible heater of apparatus 20.

Although not shown in detail, it is to be understood that apparatus 20 comprises a furnace of the type described and illustrated in U.S. Pat. Nos. 4,544,528, 4,239,583, 4,267,151 and 4,318,769. More specifically, apparatus 20 comprises a crucible 24 for containing a melt of the semiconductor material to be crystallized, a heater coil 26 for heating the melt, and a capillary die 28 of desired shape for forming the body 22. The capillary die may take various forms, but preferably it is in the form shown in FIG. 1 of the U.S. Pat. No. 4,544,528, except that it is shaped to grow a hollow body of round or selected polygonal shape, e.g. a nonagon or an octagon. A pair of fixed parallel rails 29 and a frame 30 mounted for slidable movement thereon are provided for use in drawing a crystalline body 22 out of the melt. An aperture 32 (see drawing) is provided in frame 30 and an attachment plate 34 is secured to the frame adjacent the aperture. A pulling mechanism 35, of the type well known in the art, is supported above crucible 24 at a fixed location axially distal thereto and is coupled to frame 30 via attachment plate 34 and cable 37 for pulling the latter along rails 29 and away from crucible 24 at a substantially constant rate of speed. Connected to frame 30 is seed holder 36. The latter is mechanically coupled to a seed crystal 39 (FIG. 1) from which crystalline body 22 is grown.

The foregoing brief description of apparatus 20 is provided as background for the following description of the control system of the present invention and melt replenishment system 18. For a more detailed description of an example of a suitable apparatus 20, attention is directed to the aforementioned U.S. Pat. No. 4,544,528 issued to Stormont et al, which is incorporated herein by reference.

Still referring to FIG. 1, a preferred embodiment of the control system of the present invention comprises weight sensor 100, length sensor 101, pressure sensor 102, true weight circuit 104, and controller 105. In the preferred embodiment, seed holder 36 is constructed so as to substantially pneumatically block the upper end of the growing hollow body so as to limit the quantity of fluid that can escape from the inside of the body through the upper end thereof. Seed holder 36 comprises a surface 37 that extends normally to the axis of tubular crystal 22 and a conduit 38 that fluidly couples the interior of crystal 22 with the exterior of the seed holder.

By constructing seed holder 36 so that the latter and seed 38 almost completely block off the end of crystal body 22, as noted above, the magnitude of the pressure fluctuations inside the body is greatly increased, as compared to the fluctuations that occur inside an unsealed crystal of the type grown with the apparatus disclosed in the aforementioned U.S. patent application No. 4,544,528. The errors in weight measurement that are consequent to these pressure fluctuations motivate the need and use of pressure sensor 102 and the true weight circuit 104.

Weight sensor 100 is fixed to attachment plate 34 and is coupled to and supports seed holder 36 by an axially extendible rod 106. Weight sensor 100 measures the weight of crystalline body 22 and seed holder 36, including rod 106 and seed 39. The output of weight sensor 100 is carried on line 108 to true weight circuit 104. Weight sensor 100 may be a conventional strain gauge load cell.

By way of example but not limitation, length sensor 101 is provided for measuring the displacement of frame 30 relative to fixed crucible 24. Length sensor 101 is attached to a fixed object, preferably to pulling mechanism 35, positioned above crucible 24. Length sensor 101 comprises a conventional drum and cable length measuring transducer with a cable 103 connected to frame 30. As pulling mechanism 35 acts through cable 37 to pull frame 30 along rails 29, cable 103 is wound around the drum (not shown). The amount of cable wound onto the drum corresponds to the length of the crystal and is measured by a potentiometer coupled to the drum and responsive to the drum's rotation. The output of the potentiometer of length sensor 101 is carried on line 109 to controller 105.

Pressure sensor 102 is provided for measuring the pressure inside crystalline body 22 acting upwardly against seed holder surface 37. Pressure sensor 102 is fluidly coupled by a tube 116 to a conduit 38 provided in seed holder 36 and hence to the interior of body 22. Pressure sensor 102 may be mounted to attachment plate 34 or to any other suitable element. The output of pressure sensor 102 is transmitted on line 118 to true weight circuit 104. Preferably but not necessarily, pressure sensor 102 is a capacitive-type sensor and produces an electrical signal for use in the true weight circuit.

Figure 2:
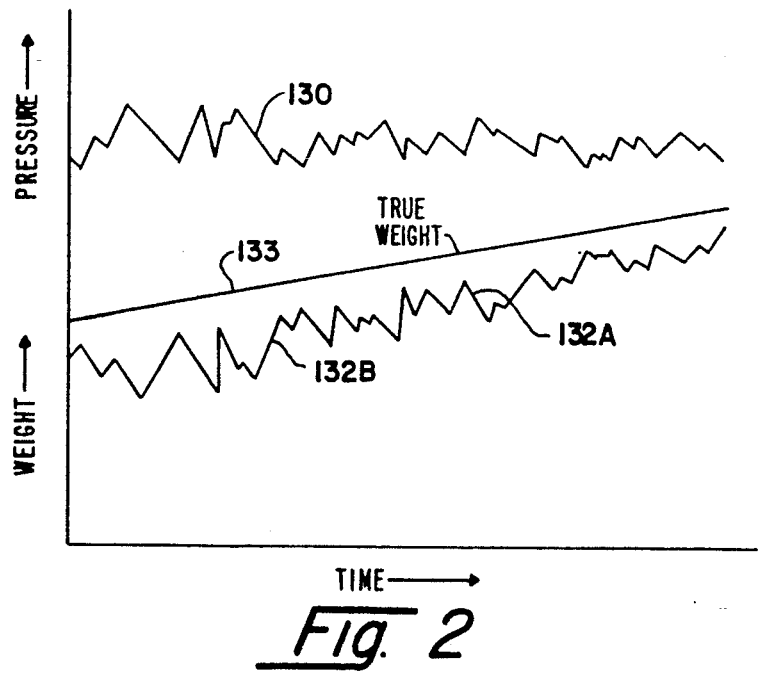
FIG. 2 is a chart that graphically illustrates the output, over time, of the pressure sensor and the weight sensor of the present invention relative to the true weight of the crystal.
Figure 3:
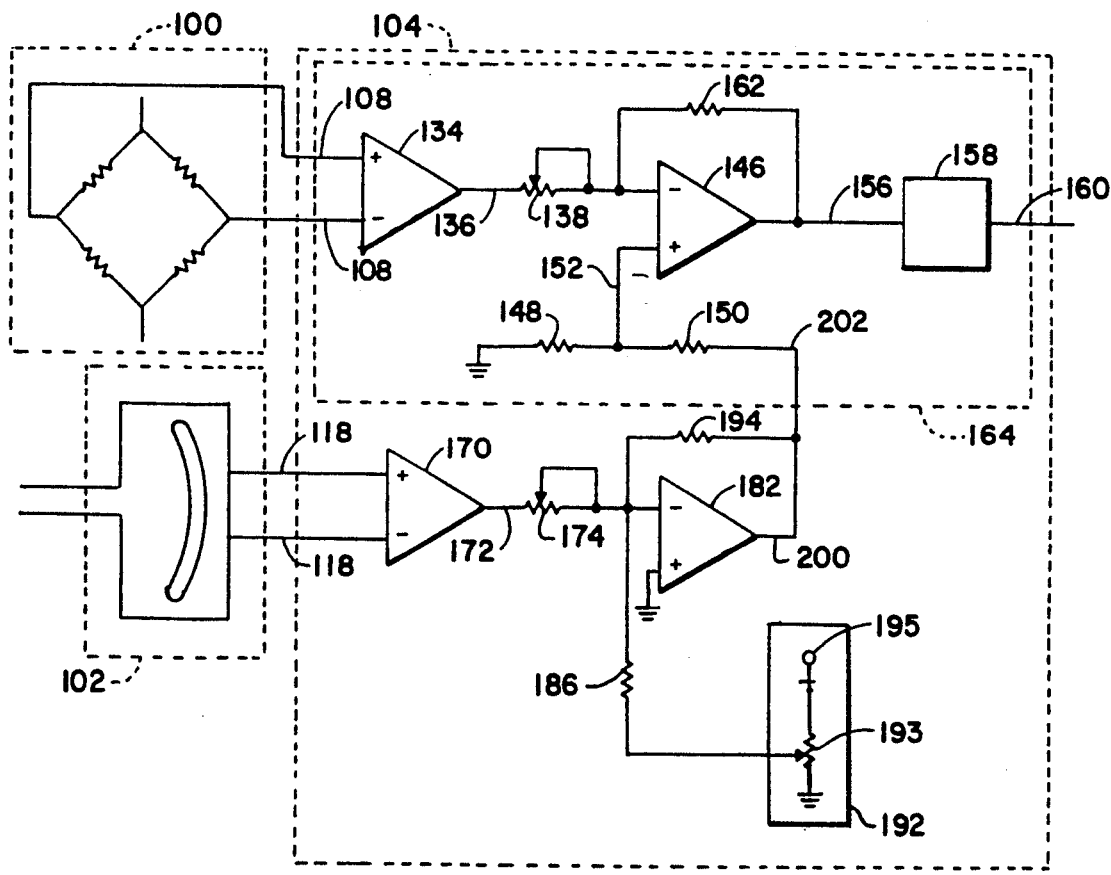
FIG. 3 is a circuit diagram of the true weight circuit employed in the preferred embodiment of the present invention.

Referring now to FIGS. 1-3, true weight circuit 104 is provided for continuously generating a signal that is representative of the true weight of growing crystalline body 22 at any selected interval during the crystal growth process. Briefly, true weight circuit 104 combines the outputs of weight sensor 100 and pressure sensor 102 to generate a "true weight" signal that is representative of the true weight of growing crystalline silicon body 22, seed holder 36, and seed 39. An offset voltage signal (described hereinafter) is then subtracted from the true weight signal to provide a signal that is representative of the "true weight" of only the growing crystalline body 22.

The true weight of growing body 22 cannot be measured directly by weight sensor 100 due to a fluid pressure force generated within the body that acts upwardly against seed holder surface 37. When the pressure force acting on surface 37 increases, the growing crystalline body 22 is lifted against the pull of gravity, causing the output signal of weight sensor 100, which is representative of the weight of crystal body 22, to decrease, as illustrated by the downward spikes 132A in FIG. 2. Likewise, when the force acting on surface 37 decreases, weight sensor 100 detects an increase in the weight of crystal body 22, as illustrated by the upward spikes 132B in FIG. 2. These variations in the output signal of weight sensor 100 reduce the accuracy of the control information fed into controller 105. The pressure fluctuations inside crystal body 22, measured by pressure sensor 102, vary in inverse relationship with the weight measurements made by weight sensor 100. By summing together the signal outputs of the weight and pressure sensors 100 and 102 respectively, as described in greater detail below, a "true weight" signal representative of the true weight of crystalline body 22, illustrated by line 133 in FIG. 2, can be generated by true weight circuit 104.

Referring now to FIG. 3, the output of weight sensor 100 is connected via lines 108 to an operational amplifier 134. Amplifier 134 is connected by line 136 to a weight calibration potentiometer 138. The latter is connected to the negative junction of summing amplifier 146. One terminal of a resistor 148 is connected by line 152 to the positive input junction of amplifier 146 and the other terminal of resistor 148 is connected to ground. One terminal of a resistor 150 is also connected via line 152 to the positive junction of amplifier 146. The other terminal of resistor 150 is connected to another portion of true weight circuit 104, as described below. The output of amplifier 146 is connected over line 156 to a filter 158, and the output of the latter is supplied over line 160 to controller 105. A feedback resistor 162 is connected between output line 156 and the negative input terminal of amplifier 146 in the conventional configuration for summing amplifiers.

The foregoing elements 134–162, inclusive, provide signal conditioning of the output of weight sensor 100, as is well known in the art. Weight calibration potentiometer 138 is used to calibrate the output of true weight circuit 104 to accommodate any variation in sensitivity of weight sensor 100.

The output of pressure sensor 102 is supplied on lines 118 to operational amplifier 170. The latter is connected on line 172 to pressure calibration potentiometer 174, which potentiometer is connected to the negative input junction of summing amplifier 182. The positive junction of amplifier 182 is connected to ground. An offset voltage source 192 is connected by resistor 186 to the negative input junction of summing amplifier 182. Offset voltage source 192 comprises a conventional potentiometer 193 and a suitable potential 195. A resistor 194 connects resistor 186 to the output terminal of amplifier 182, and also to the positive input terminal of amplifier 146, via resistor 150, in the conventional configuration for summing amplifiers. The polarity of the output signal of offset voltage source 192 is selected such that when the former signal is added to the output signal of weight sensor 100, through amplifier 182 and associated resistors 186, 194 and 150, the magnitude of the latter signal is reduced, as described in greater detail hereinafter. The output of amplifier 182 on line 200 is connected via line 202 to ground and also to one terminal of resistor 150. As noted above, that terminal of resistor 150 is connected via line 152 to the positive junction of amplifier 146.

The offset signal derived from voltage source 192 via resistor 186 is combined with the output signal of pressure sensor 102, and the resultant signal is amplified by amplifier 182. The output signal of amplifier 182 is summed with the output signal of weight sensor 100 at summing amplifier 146. Weight calibration potentiometer 138 and pressure calibration potentiometer 174 are adjusted to scale the output signals of the weight sensor 100 and pressure sensor 102 respectively, so that at any point in time, the magnitude of the pressure signal on line 172 is equal and opposite to the portion of the weight signal on line 136 resulting from the pressure acting on seed holder surface 37. For instance, at a selected measurement interval, the output signal of weight sensor 100, as scaled by amplifier 134 and potentiometer 138, may be +1.5 v., and the output signal of pressure sensor 102, as scaled by amplifiers 170 and 182, and the associated resistances, may be −0.5 v. By adding the outputs of weight sensor 100 and pressure sensor 102 at amplifier 146, a summation of the output signals is obtained, i.e. +1.0 v., which is representative of the true weight of crystalline body 22, seed 39, and seed holder 36 at the selected measurement interval.

The output signal of offset voltage source 192, amplified through amplifier 182, results in a constant bias correcting signal which, when applied to amplifier 146, reduces the output of the latter by an amount corresponding to the weight of seed 39 and seed holder 36. As a consequence, the output signal of amplifier 146 represents the true weight of crystalline body 22.

The true weight signal on line 156 is processed through filter circuit 158, which attenuates undesirable components resulting from mechanical vibrations and electrical noise generated within the weight sensor. This signal is then conducted to controller 105 via line 160. As described in greater detail hereinafter, controller 105 (which may take one of a variety of forms including, for instance, an industrial process digital minicomputer) uses this true weight signal in controlling the operation of melt replenishment assembly.

With continuing reference to FIG. 1, melt replenishment system 18 includes a container 302 for storing solid silicon particles. Container 302 is coupled with conduit 304 via an aperture (not shown) in the bottom wall of the container. Conduit 304 is hollow along its entire length and is open at both ends.

System 18 also comprises a dispenser 306 coupled with container 302 for causing a selected quantity of silicon particles stored in the container to pass through the bottom aperture in the container and into conduit 304 during a selected time interval. Dispenser 306 may constitute, for example, a vibratory feeder, a pneumatic feeder or other known feeder system, the only requirement being that the mass of particles dispensed by dispenser 306 over a given time interval be precisely controllable. Dispenser 306 is coupled with controller 105 via line 308.

As is known, vibratory feeders for solid particles, e.g., silicon particles, are commonly operated in a continuous mode, with the quantity of particles dispensed by the feeder per unit time varying with the control signal provided thereto, i.e., the amplitude of the electrical control signal for the vibrating feeder is varied to change the rate at which it dispenses particles. Alternatively, vibratory feeders may be operated in a discontinuous mode, with a fixed quantity of silicon particles being dispensed by the vibratory feeder every time an actuation signal of predetermined value is provided thereto Thus, in the discontinuous mode, the total quantity of silicon particles dispensed by the vibratory feeder in a selected time interval may be dependent upon the number of actuation signals received by the vibratory feeder during the selected time interval.

An electronic scale 312 is provided for generating an output signal which is representative of the weight of solid silicon particles stored in container 302. Container 302, and typically dispenser 306 as well, is supported by scale 312. Scale 312 includes adjustment means (not shown) for adjusting the value of its output signal, so that the latter is representative of only the weight of the solid silicon particles stored in container 302, and not the weight of the container and dispenser 306. The output signal generated by scale 312 is carried over line 314 to controller 105.

Melt replenishment system 18 further includes a feeder mechanism 320 for feeding solid silicon particles into crucible 24. Feeder mechanism 320 has a hollow interior 322 which is coupled with the interior of conduit 304 via an aperture (not shown) in the side wall of the feeder mechanism. Feeder mechanism 320 is positioned below container 302, with the result that conduit 304 slopes downwardly from container 302 to the feeder mechanism. Feeder mechanism 320 includes a hollow pipe 324 which is attached to the top wall of the feeder mechanism and is coupled with interior 322 of the feeder mechanism via an aperture (not shown) in the top wall of the feeder mechanism. Pipe 324 is sized and feeder mechanism 320 is positioned directly underneath crucible 24 so as to permit the pipe to extend up through the center of the crucible and terminate above the surface of the melt contained in crucible 24.

Feeder mechanism 320 transports solid silicon particles present in its interior 322 up through pipe 324 so that the particles are discharged or ejected from the top end of the pipe. Then, under the pull of gravity, the discharged particles fall into the melt contained in crucible 24. A number of different devices may be used as feeder mechanism 320, an exemplary one of which is disclosed in U.S. Pat. No. 4,661,324 (the '324 feeder) The '324 feeder mechanically ejects silicon particles present in its particle receipt chamber up through a pipe 324 at regular intervals. Other feeder mechanisms may also be satisfactorily employed so long as the mechanisms feed the silicon particles into crucible 24 at a rate consistent with the rate that they are received from dispenser 306.

Turning now to FIGS. 1-5, controller 105, using input signal information provided thereto, controls the operation of melt replenishment system 18 in accordance with one of two machine control software programs so that solid silicon particles are delivered to the melt at substantially the same rate that molten silicon is consumed from crucible 24 as a result of the growth of crystalline body 22. These software programs, which are illustrated by the flow diagrams in FIGS. 4 and 5, respectively, provide a logical outline of the operations performed by the software programs. Line by line coding of the software programs is not illustrated or described herein, as such coding is considered to be well within the skill of an ordinary practitioner and will vary according to the computer used to run the software.

Figure 4:
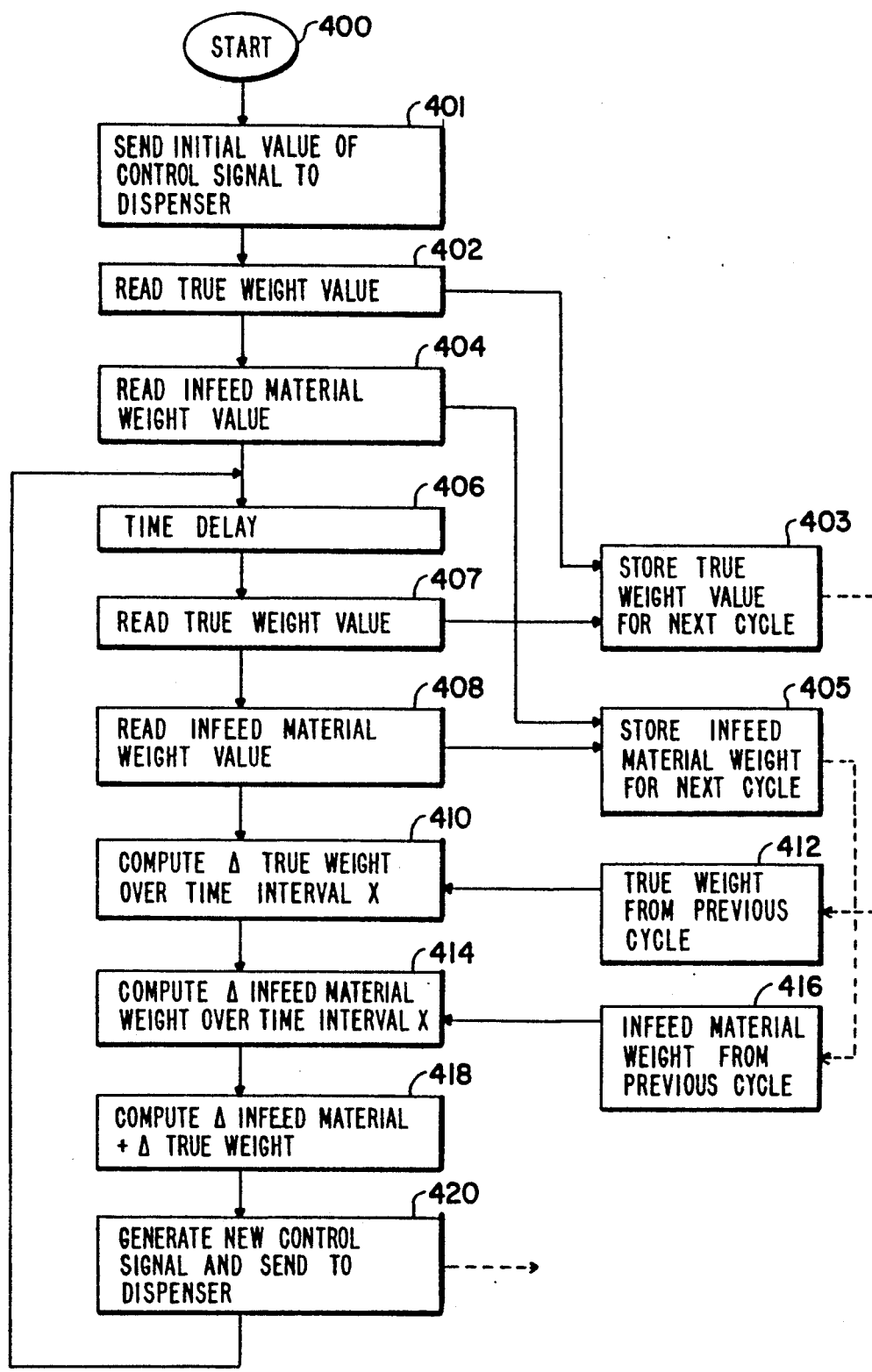
FIG. 4 is a software flow diagram of one program used by the control system of the present invention in controlling the operation of a melt replenishment system designed for use with a crystal growing apparatus.
Figure 5:
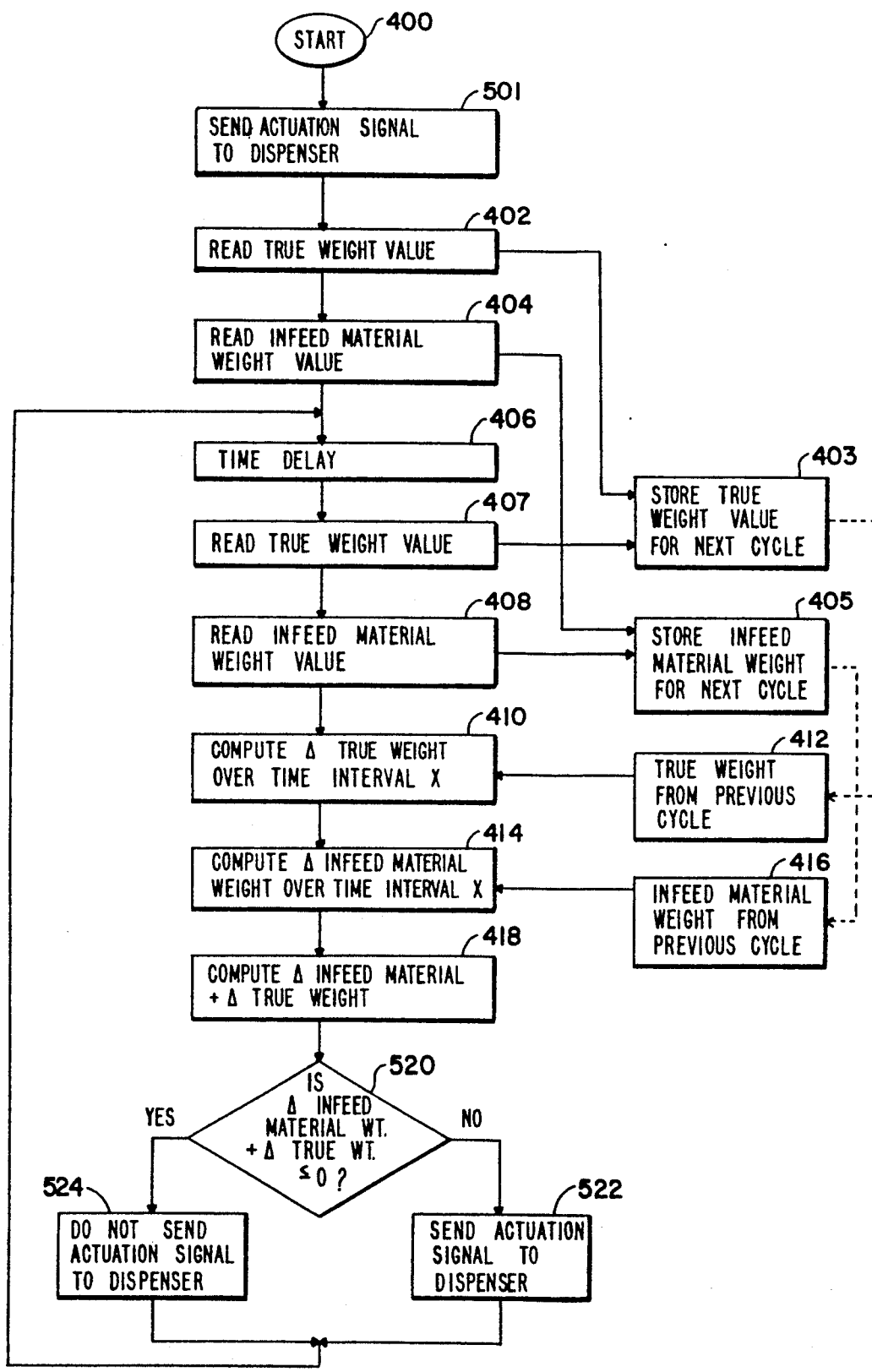
FIG. 5 is a software flow diagram of another program used by the control system of the present invention in controlling the operation of a melt replenishment system designed for use with a crystal growing apparatus.

The software program illustrated in FIG. 4 is designed to control a melt replenishment system having a silicon dispenser which is operated in a continuous mode. The software program illustrated in FIG. 5 is designed to control a melt replenishment system having a silicon dispenser which is operated in a discontinuous mode.

The software flow diagram illustrated in FIG. 4 will be described first, followed by a description of the software flow diagram illustrated in FIG. 5.

When melt replenishment system 18 is operated in accordance with the software flow diagram illustrated in FIG. 4, dispenser 306 preferably is a vibratory feeder which continuously dispenses source material from container 302 at a rate which depends upon the feed rate information in the control signal provided to the vibratory feeder. Alternatively, dispenser 306 may be a pneumatic feeder which continuously dispenses source material from container 302 at a rate which depends upon the feed rate information in the control signal provided to the pneumatic feeder.

As the first step in the software flow diagram illustrated in FIG. 4, the control system of the present invention is activated so as to begin controlling the operation of melt replenishment system 18, as illustrated by step 400. At the same time, apparatus 20 is activated so as to begin growing crystalline body 22.

Then, at step 401, controller 105 sends an initial control signal to dispenser 306. Upon receipt of this control signal, dispenser 306 dispenses source material (e.g. solid silicon particles) from container 302 at a selected rate. The feed rate information in this initial control signal is selected based on empirical data regarding the rate at which apparatus 20 is expected to consume molten silicon in forming crystalline body 22. In the event the feed rate information contained in the control signal provided at step 401 is inaccurate and source material is provided by dispenser 306 at a rate which exceeds or is less than the rate at which apparatus 20 consumes molten silicon, such inaccuracies are corrected in subsequent steps of the program, as described hereinafter.

Next, at step 402, controller 105 reads in over line 160 the current true weight of crystalline body 22 provided by true weight circuit 104. The structure and operation of the latter is described above. The current true weight value is then stored for the next cycle, as indicated by step 403.

Thereafter, the output of scale 312 which is representative of the current weight of the source material, e.g. silicon particles, in container 302, is read in over line 314 by controller 105, as indicated by step 404. Then, at step 405, the current weight of the source material is stored for the next cycle.

Steps 402 and 404 are part of an initialization routine which is provided to ensure that meaningful true weight data and infeed material weight data are provided for use in generating the control signal for controlling the operation of dispenser 306 during the first iteration of the software program illustrated in steps 406-420, as discussed hereinafter.

Next, at step 406, a time delay is introduced during which a selected amount of crystal growth occurs. This time delay is, for all practical purposes, equal to the measurement interval between successive readings of the weight data used in generating the control signal for the dispenser. This interval is hereinafter referred to as "time interval X" or "measurement interval X".

Then, at step 407, the current true weight of crystalline body 22 provided by true weight circuit 104 is read in. This current true weight value will differ from the true weight value read in at step 402 because the crystalline body 22 has gained weight during the crystal growth that occurred during the time delay at step 406. The current true weight information read in at step 407 is stored for the next cycle, as indicated by step 403. The current true weight information read in at step 407 and stored at step 403 is stored along with the current true weight information provided at step 402 which was previously stored at step 403.

Thereafter, at step 408, the infeed material weight value generated by scale 312 is read in. This infeed material weight will differ from the infeed material weight generated at step 404 because some infeed material is consumed during the crystal growth which occurs during the time delay at step 406. The infeed material weight information generated at step 408 is stored for the next cycle, as indicated by step 405. The infeed material weight information read in at step 408 and stored at step 405 is stored along with the infeed material weight information generated at step 404 and previously stored at step 405.

Next, at step 410, the change in true weight of the crystalline body 22 over measurement interval X is computed. This derivation is performed using current true weight data read in at step 407 and true weight data from the previous measurement cycle read in at step 402. Current true weight data is supplied directly from true weight circuit 104 and previous cycle true weight data is read in, as illustrated by step 412, using the data stored at step 403. Because crystalline body 22 is always gaining weight, the result of this change in true weight calculation will always be positive. Measurement interval X preferably ranges between about 10 seconds and 3 minutes. Measurement interval X can be stored in controller 105 as a fixed setpoint or the interval can be entered as a control variable at the beginning of a crystal-growing operation.

Then, the change in weight of the source material in container 302 over the time interval X is computed, as illustrated by step 414. This derivation is performed using current source material weight data read in at step 404 and source material weight data from the previous measurement cycle read in at step 404. Current source material weight data is supplied directly from scale 312 and source material weight data from the previous cycle is read in, as illustrated by step 416, using the data stored at step 405. Because the weight of source material in container 302 is always decreasing, the result of this change in source material weight will always be negative. The time interval X used in step 414 is identical to time interval X used in step 410, i.e., X preferably ranges from about 10 seconds to 3 minutes.

At step 418, the change in source material weight calculated at step 414 is added to the change in true weight calculated at step 410. When the weight gain of crystalline body 22 over time interval X is equal to the weight loss of the source material in container 302 over time interval X, the result of this calculation will be zero. When crystalline body 22 gains more weight or less weight over time interval X than is lost by the source material in container 302 during the interval X, the result of the calculation performed at step 418 will have either a positive or negative sign and a non-zero magnitude.

Next, at step 420, controller 105 sends a control signal to dispenser 306. This control signal contains feed rate information which varies with the sign and magnitude of the result of the computation performed at step 418. When the result of the computation performed at step 418 is equal to zero, then the feed rate information contained in the control signal provided to dispenser 306 directs the latter to continue dispensing source material at the current feed rate. When the result of the computation performed at step 418 has a negative sign, then the feed rate information contained in the control signal directs the dispenser 306 to dispense source material at a decreased feed rate, which decreased feed rate is proportional to the magnitude of the result generated at step 418. When the result of the computation performed at step 418 has a positive sign, then the feed rate information contained in the control signal directs the dispenser 306 to dispense source material at an increased feed rate, which increased feed rate is proportional to the magnitude of the result generated at step 418.

Infeed material dispensed by dispenser 306 from container 302 travels downwardly through conduit 304 into the interior 322 of feed mechanism 320. Then, the particles are forced up through hollow pipe 324 and are ejected from the top end of the pipe. Under the pull of gravity, the ejected particles fall into the molten silicon supported in crucible 24.

After step 420, the program loops back to step 406, and a time delay is again introduced.

The foregoing is a description of the first iteration of the program illustrated by the software flow diagram shown in FIG. 4. The second and subsequent iterations of this program differ from the first iteration in several respects. First, during the second and subsequent iterations, the change in true weight calculated at step 410 is calculated based on the true weight information currently being generated at step 407 and the true weight information previously generated at step 407, stored at step 403, and provided at step 412. Second, during the second and subsequent iterations, the change in infeed material weight calculated at step 414 is calculated based on (1) the infeed material weight information currently being generated at step 408, and (2) the infeed material weight information generated at step 408 during the previous iteration of the software, which was stored at step 405, and is provided at step 416. Thus, during the second and subsequent iterations, the information generated at steps 402 and 404 is not used.

When melt replenishment system 18 is operated in a discontinuous mode, the software program illustrated by the flow diagram of FIG. 5 is used. When melt replenishment system 300 is operated in accordance with the software flow diagram illustrated in FIG. 5, dispenser 306 preferably is a pneumatic feeder which dispenses a fixed quantity of source material from container 302 upon receipt of an actuation signal from controller 105. Alternatively, dispenser 302 may be a vibratory feeder which dispenses a fixed quantity of source material from container 302 upon receipt of an actuation signal from controller 105.

As the first step in the software flow diagram illustrated in FIG. 5, the control system of the present invention is activated so as to begin controlling the operation of melt replenishment system 18, as illustrated by step 400. This step is identical to the first step of the program illustrated in FIG. 4 and discussed above. At the same time, apparatus 20 is activated so as to begin growing crystalline body 22 from the melt in crucible 24.

Then, at step 501, controller 105 sends an initial actuation signal to dispenser 306. Upon receipt of this actuation signal, dispenser 306 dispenses a fixed quantity of source material from container 302. The weight of this fixed quantity of source material is chosen by taking into consideration the volume of the melt in crucible 24, the manner in which the source material is delivered to the melt, and other factors. In any event, the weight of the fixed quantity of source material is relatively small so that the addition of this quantity of material to the melt of apparatus 20 will not cause unacceptably large thermal perturbations in the melt.

Next, the software program illustrated in FIG. 5 follows steps 402-418, inclusive, used in the software program illustrated in FIG. 4. For a description of steps 402-418, attention is directed to the foregoing description of the software program illustrated in FIG. 4.

Then, following step 418, a determination is made as to whether or not the sum calculated at step 418 is less than or equal to zero, as indicated by step 520. If the sum calculated at step 418 is not less than or equal to zero, then controller 105 sends an actuation signal to dispenser 306 over line 308 which actuates the dispenser causing the latter to dispense a fixed quantity of source material from container 302 into conduit 304, as illustrated at step 522. If the sum calculated at step 418 is less than or equal to zero, then controller 105 does not send an actuation signal to dispenser 306, as illustrated at step 524. As a result, no source material is dispensed from container 302.

Finally, the software flow diagram of FIG. 5 terminates in the same manner as the software flow diagram of FIG. 4, i.e., the program loops back to step 406 and introduces a time delay.

Figure 6:
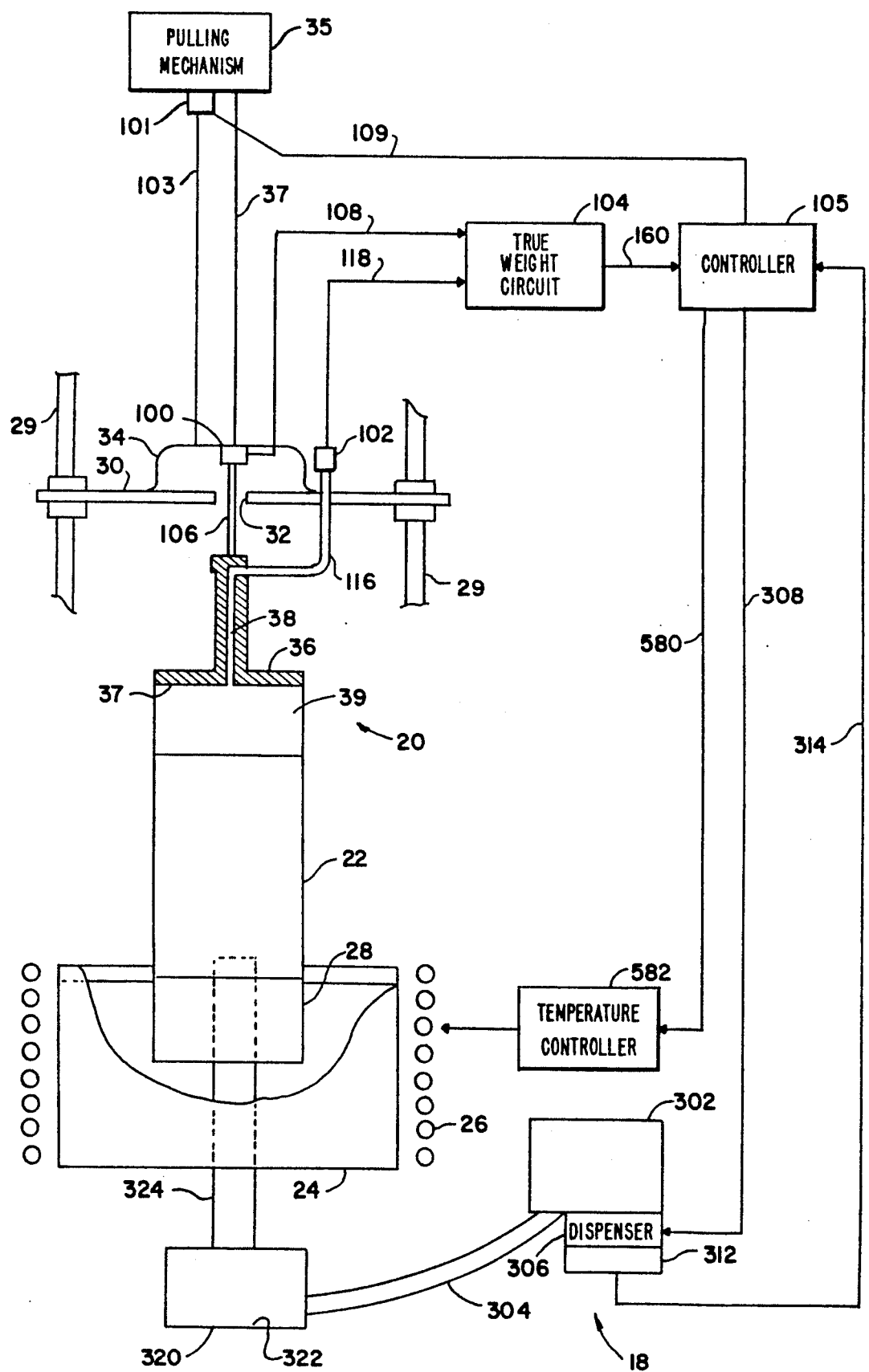
FIG. 6 is a schematic illustration, partly in section, of an alternative embodiment of the present invention.
Figure 7:
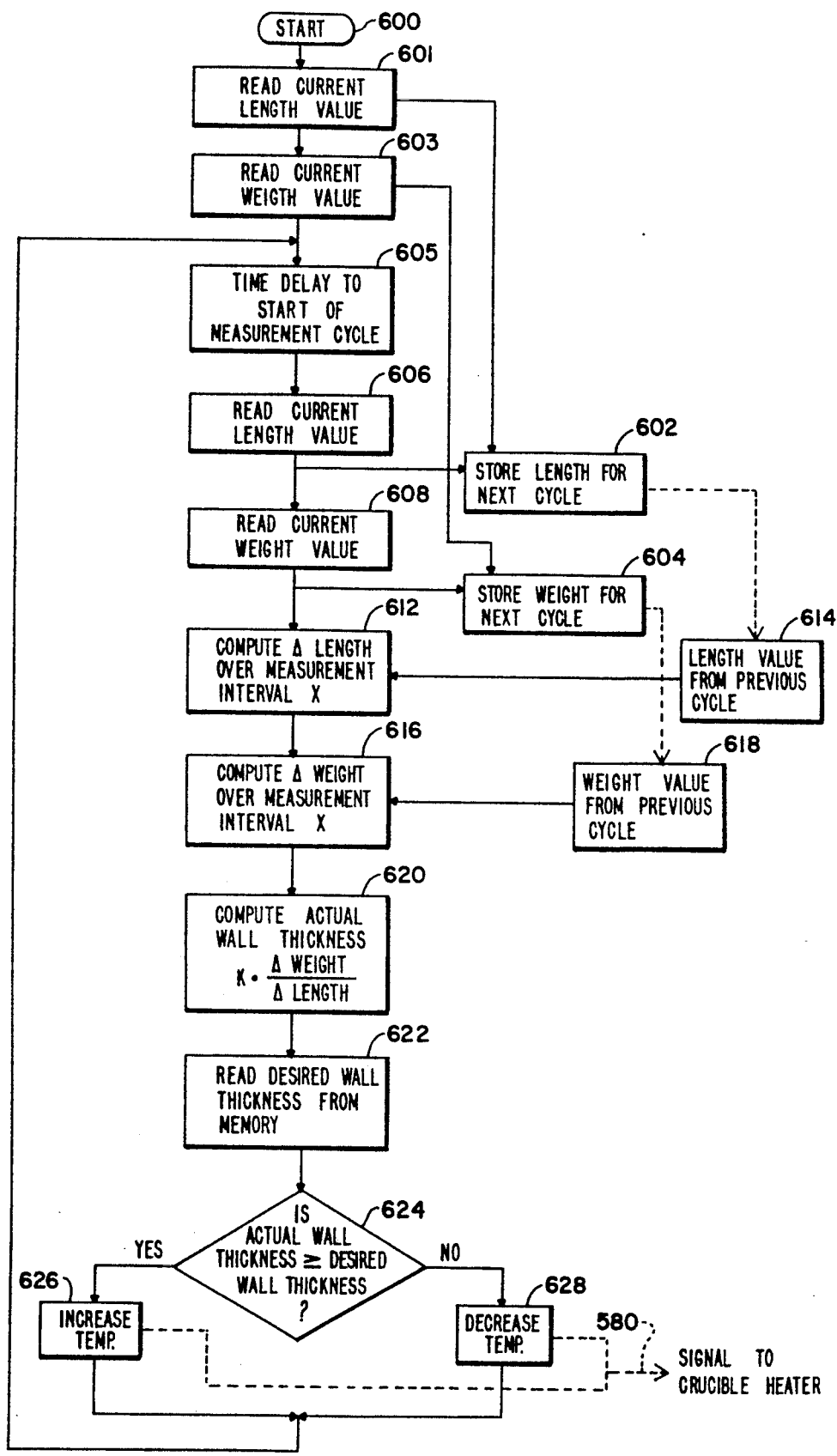
FIG. 7 is a software flow diagram illustrating the various operations performed by the control system of the present invention in controlling the operation of a crystal growing apparatus.

In an alternative embodiment shown in FIGS. 6 and 7, the control system of the present invention is adapted to control melt replenishment system 18 as well as crucible heater 26 of apparatus 20.

Referring to FIG. 3, 6, and 7, in the alternative embodiment, crucible heater 26 and a conventional, closed-loop temperature control system, represented in FIG. 6 as temperature controller 582, may be coupled to controller 105 via line 580. Based on the output signal on line 580 from controller 105, the temperature controller 582 varies the power input to crucible heater 26 so as to maintain the temperature in apparatus 20 at a precise reference value which is selected to ensure that the crystalline body 22 has a substantially uniform wall thickness.

For the purpose of the preferred embodiment, the power input to heater 26 may also be controlled by a conventional power controller (not shown), i.e. a device which varies the power input to heater 26 in proportion to a control signal. When a power controller is used to control heater 26, the power controller replaces temperature controller 582 and is coupled to controller 105 and heater 26 in the same manner as the temperature controller. Both the power controller and temperature controller 582 achieve a similar result: they cause the heat output of heater 26, and hence the temperature of the heated portions of apparatus 20, to vary based on a control signal provided by controller 105 so as to ensure that the growing crystalline body 22 has a substantially uniform wall thickness.

In this alternative embodiment of the present invention, the control system controls the operation of melt replenishment system 18 in the manner described above in connection with the preferred embodiment shown in FIGS. 1-5. Hence, the following description of the alternative embodiment mentions by reference the description presented above of the mode of operation of the preferred embodiment.

With the alternative embodiment of the present invention, pulling mechanism 35 is controlled so as to draw crystalline body 22 out of crucible 24 at a constant rate of speed. Thus, the wall thickness of the crystal grown from apparatus 20 may be controlled solely by adjusting the output of crucible heater 26, which in turn controls the temperature in the growth zone, i.e., at the meniscus. Controller 105 provides the temperature control signal used to effect this adjustment of crucible heater 26.

Controller 105, using input signal information provided thereto, controls the operation of crucible heater 26 in accordance with a machine control software program. The software flow diagram illustrated in FIG. 7 provides a logical outline of the operations performed by the software program. Line by line coding of the software program is not illustrated or described herein, as such coding is considered to be well within the skill of an ordinary practitioner and will vary according to the computer used to run the software.

As the first step in the flow diagram, the control system of the present invention is activated so as to begin controlling the operation of apparatus 20, as illustrated by step 600. Next, controller 105 reads in the current length of crystalline body 22, as illustrated by step 601. Length transducer 101 provides this current length information over line 109 to controller 105. Next, at step 602, the current length information is stored for the next cycle. Thereafter, controller 105 reads in the current weight of the crystalline body, as illustrated at step 603. This current weight information is generated by true weight circuit 104 and is provided to controller 105 over line 160. Next, at step 604, the current weight information is stored for the next cycle.

Steps 601 and 603 are part of an initialization routine which is provided to ensure that measuring full current length data and true weight data are provided for use in generating the control signal for controlling the operation of crucible heater 26 during the first iteration of the software program illustrated in steps 606-628, as discussed hereinafter.

Next, at step 605, a time delay is introduced during which a selected amount of crystal growth occurs. This time delay is approximately equal to the measurement interval x during which data is collected for use in generating the control signal for the crucible heater.

Then, at step 606, the current length of crystalline body 22 is read in. This current length information will differ from the length information read in at step 601 because the crystalline body 22 has gained length during the crystal growth that occurred during the time delay at step 605. The current length information read in at step 606 is stored for the next cycle, as indicated by step 602. The current length information read in at step 606 and stored at step 602 is stored along with the current length information provided at step 601 which was previously stored at step 602.

Thereafter, at step 608, the current true weight of crystalline body 22 is read in. This current true weight will differ from the true weight generated at step 603 because the weight of crystalline body 22 has increased during the crystal growth which occurs during the time delay at step 605. The true weight information generated at step 608 is stored for the next cycle, as indicated by step 604. This true weight information read in at step 608 and stored at step 604 is stored along with the true weight information generated at step 603 and previously stored at step 604.

Thereafter, the change in length of crystalline body 22 over measurement interval X is computed, as illustrated by step 612. This derivation is performed using current length data read in at step 606 and length data from the previous measurement cycle read in at step 601. Current length data is supplied directly from length transducer 101 and previous cycle length data is read in, as illustrated by step 614, using the data stored at step 602. Measurement interval X preferably ranges between about 30 seconds and 3 minutes. Measurement interval X can be stored in controller 105 as a fixed setpoint or the interval can be entered as a control variable at the beginning of a crystal-growing operation.

Next, the change in weight of crystalline body 22 over the measurement interval X is computed, as illustrated by step 616. This derivation is performed using current weight data read in at step 608 and weight data from the previous measurement cycle read in at step 603. Current weight data is supplied directly from true weight circuit 104 and previous cycle weight data is read in, as illustrated by step 618, using the data stored at step 604. Measurement interval X used in step 616 is identical to measurement interval X used in step 612, i.e., X preferably ranges from about 30 seconds to 3 minutes.

Then, at step 620, the actual wall thickness of crystalline body 22 is calculated by multiplying a constant, K, by the change in weight of the crystalline body calculated in step 616 and then dividing this product by the change in length of body 22 calculated in step 612. As one skilled in the art will recognize, K is a wall thickness conversion constant that is selected on the basis of the material density, the circumference of the crystalline body to be grown, and the magnitude of the output signals of length sensor 100 and true weight circuit 104.

Next, desired wall thickness information is read from memory, as illustrated by step 622. Thereafter, at step 624, the actual wall thickness calculated at step 620 is compared to the desired wall thickness read in at step 622 to determine if the actual wall thickness is greater than or equal to the desired wall thickness. If the actual wall thickness is greater than or equal to the desired wall thickness, the flow diagram proceeds to step 626, whereat controller 105 generates a temperature increase signal that is supplied on line 580 to crucible heater 26. Upon receipt of this increase signal, crucible heater 26 will operate so as to elevate the temperature of the melt, which in turn will cause the wall thickness of the crystalline body 22 to decrease. If the actual wall thickness is not greater than or equal to the desired wall thickness, the flow diagram proceeds to step 628, whereat controller generates a temperature decrease signal that is supplied on line 630 to crucible heater 26. Upon receipt of this decrease signal, crucible heater 26 will operate so as to allow the temperature of the melt to decrease which, in turn, will cause the wall thickness of the crystalline body 22 to increase.

After either step 626 or 623, as the cause may be, the program loops back to step 605 and another time delay is introduced.

The foregoing is a description of the first iteration of the program illustrated by the software flow diagram shown in FIG. 7. The second and subsequent iterations of this program differ from the first iteration in several respects First, during the second and subsequent iterations, the change in length calculated at step 612 is calculated based on the length information currently being generated at step 606 during the previous iteration of the software, which was stored at step 602, and is provided at step 614. Second, during the second and subsequent iterations, the change in current weight calculated at step 616 is calculated based on the true weight information currently being generated at step 608 and the true weight information generated at step 608 during the previous iteration of the software, which was stored at step 604, and is provided at step 618. Thus, during the second and subsequent iterations, the information generated at steps 601 and 603 is not used.

When the melt replenishment system disclosed by Taylor et al. is coupled to a crystal growth apparatus of the type described in U.S. Pat. No. 4,544,528 which has been modified so that the seed holder substantially pneumatically blocks the upper end of a growing hollow crystalline body, it is nearly impossible under most circumstances to add solid silicon to the melt at the same rate molten silicon is being consumed. Such melt replenishment is problematic due to the erroneous weight information generated by the sensor for measuring the weight of the growing crystalline body. As discussed above, such erroneous information is created by pressure fluctuations within the growing body. Inasmuch as the weight information generated by the weight sensor is used in calculating the quantity of solid silicon to be dispensed per unit time by dispenser 306, when this weight information is inaccurate the quantity of silicon fed into the melt will be other than what is desired. As such, more or less silicon may be added than is required, with the result that unacceptably large thermal excursions are created in the melt. As is known, thermal excursions can result in the production of crystalline bodies having less than optimal physical and electrical characteristics and, in extreme cases, can lead to the termination of the crystal growth process.

By way of contrast, with the present invention, silicon particles are fed into crucible 24 at the same rate that molten silicon is consumed from the melt. As such, the formation of thermal perturbations is minimized with the result that the physical and electrical characteristics of the crystalline body are optimized.

In addition to controlling melt replenishment system 18, the alternative embodiment of the present invention shown in FIGS. 6 and 7 is adapted to control the operation of known crystal growing apparatus 20 with greater accuracy than is typically obtainable with known control systems. By controlling accurately the operation of known crystal growing apparatus, several important advantages are achieved. First, the frequency with which a growing crystalline body 22 will detach from, or freeze to, the die is greatly reduced. Second, the wall thickness of the tubular crystalline body is more accurately controlled. Third, crystal bodies 22 having lengths of up to 6 meters or more can be grown with relatively constant wall thickness using known crystal growing apparatus controlled by the present invention and modified so as to substantially pneumatically seal the top end of the crystal being grown. Material costs for silicon sheet produced from long crystalline bodies, e.g. bodies 6 meters long, are significantly less than for sheet produced from the relatively short crystalline bodies that are grown with known crystal growing apparatus, due to the reduction in apparatus start-up time relative to the length of crystal grown.

While the alternative embodiment of the invention shown in FIGS. 6 and 7 is designed to vary the heating of the crucible so as to control wall thickness (the pulling speed being held substantially constant), the invention may be designed so that the heating or temperature is held constant and the pulling speed is varied so as to control wall thickness. Alternatively, both the heating and the pulling speed may be varied so as to produce a crystal having a substantially uniform wall thickness.

The essential and advantageous feature of the present invention is that the melt replenishment system is controlled so that the length of melt in the crucible can be kept within predetermined limits during growth of tubular crystalline bodies of substantially constant size and wall thickness.

Since certain changes may be made in the above apparatus without departing from the scope of the present invention, it is intended that all matter contained in the above description or shown in the accompanying drawing shall be interpreted in an illustrative and not in a limiting sense.

What is claimed is:

1. A melt replenishment system for replenishing the melt in an apparatus for growing a tubular crystalline body of a selected material, the apparatus comprising a crucible for containing a melt of said selected material, heating means for heating said crucible, growing means for growing a tubular crystalline body from said melt, said growing means comprising (1) seed holder means for supporting a seed onto which said tubular crystalline body is grown and (2) pulling means for pulling said seed holder means and said tubular crystalline body away from said crucible;

said melt replenishing system comprising:

a container for storing solid particles of said selected material;

dispenser means coupled with the container for transporting a selected quantity of particles of said selected material from said container to said crucible in response to a control signal;

weight value generating means for generating an output signal that is representative of the weight of a mass of particles of said selected material stored in said container;

weight sensor means for generating an output signal that is representative of the weight of said growing tubular crystalline body, said seed, and said seed holder means;

pressure sensor means for generating an output signal that is representative of the pressure inside said body; and controller means coupled to said weight value generating means, said weight sensor means, said pressure sensor means, and said dispenser means for controlling the operation of said melt replenishing system responsive to the output signals of said weight value generating means, said weight sensor means, and said pressure sensor means, so as to ensure that the level of melt in said crucible remains within predetermined limits during growth of said tubular crystalline body.

2. A system according to claim 1, wherein said controller means generates said control signal based on the output signals of said weight value generation means, said weight sensor means and said pressure sensor means.

3. A system according to claim 1, wherein said controller means comprises means for calculating the true weight of said tubular crystalline body and for generating a corrected output signal that is representative of the true weight of said tubular crystalline body, and further wherein said controller means generates said control signal responsive to the output signal of said weight value generating means and said corrected output signal.

4. A system according to claim 3, wherein said calculating means comprises:

means for combining the output signals of said weight sensor means and said pressure sensor means so as to generate a resultant signal that is representative of the true weight of said tubular crystalline body and said seed holder means;

means for generating an offset output signal that is representative of the true weight of said seed holder means; and means for combining said resultant signal and said offset output signal so as to generate said corrected output signal that is representative of the true weight of said tubular crystalline body.

5. A system according to claim 3, wherein said controller means comprises (a) means for calculating the change in weight of said particles stored in said container over a selected time interval X as a function of changes in said output signal generated by said weight value generation means over said selected time interval X, (b) means for calculating the change in weight of said tubular crystalline body over said selected time interval X as a function of changes in said corrected output signal over said selected time interval X, and (c) means for adding said change in weight of said silicon particles and said change in weight of said tubular crystalline body so as to produce a resultant change in weight value.

6. A system according to claim 5, wherein said dispenser means is designed to transport a fixed quantity of silicon particles from said container to said crucible upon receipt of said control signal, said controller comprising:

means for comparing said resultant change in weight value with a zero value and for providing said control signal to said dispensing means only when said resultant change in weight value is greater than said zero value.

7. A system according to claim 5 wherein said selected quantity of silicon particles transported by said dispensing means from said container to said crucible during said selected time interval X varies as a function of feed rate information contained in said control signal, further wherein said controller means generates said control signal so that it contains feed rate information which varies as a function of the sign and magnitude of said resultant change in weight value.

8. A melt replenishment system for replenishing the melt in an apparatus for growing a tubular crystalline body of a selected material, said apparatus comprising a crucible for containing a melt of said selected material, heating means for heating said crucible, and growing means for growing a tubular crystalline body from said melt, said growing means comprising (1) seed holder means for supporting a seed onto which said crystalline body is grown and (2) pulling means for pulling said seed holder means and said tubular crystalline body away from said crucible;

said melt replenishment system comprising:

a container for storing solid silicon particles;

dispenser means coupled with said container for transporting a selected quantity of particles of said selected material from said container to the crucible during a selected time interval in response to a control signal;

weight value generating means for generating an output signal that is representative of the weight of a mass of said selected material stored in said container;

weight sensor means for generating an output signal that is representative of the weight of said growing tubular crystalline body, said seed, and said seed holder means;

pressure sensor means for generating an output signal that is representative of the pressure inside said body;

controller means coupled to said weight value generating means, said weight sensor means, said pressure sensor means, and said dispenser means for controlling the operation of said dispenser means in response to the output signals of said weight value generating means, said weight sensor means, and said pressure sensor means, so as to ensure that the quantity of said selected material in said crucible will be adequate to support continuous growth of said tubular crystalline body.

9. A melt replenishment system according to claim 8 further including:

(a) means for calculating the true weight of said tubular crystalline body and for generating a corrected output signal that is representative of the true weight of said tubular crystalline body, and further wherein said controller means generates said control signal for controlling the operation of said dispensing means responsive to the output signal of said weight value generation means and said corrected output signal, said means for calculating comprising:

(i) means for combining the output signals of said weight sensor means and said pressure sensor means so as to generate a resultant signal that is representative of the true weight of said tubular crystalline body and said seed holder means;

(ii) means for generating an offset output signal that is representative of the true weight of said seed holder means; and (iii) means for combining said resultant signal and said offset output signal so as to generate said corrected output signal that is representative of the true weight of said tubular crystalline body;

(b) means for calculating the change in weight of said particles stored in said container over a selected time interval X as a function of changes in said output signal generated by said weight value generation means over said selected time interval X;

(c) means for calculating the change in weight of said tubular crystalline body over said selected time interval X as a function of changes in said corrected output signal over said selected time interval X;

(d) means for adding said change in weight of said silicon particles and said change in weight of said tubular crystalline body so as to produce a resultant change in weight value.

10. A control system for controlling the operation of (a) an apparatus for growing a tubular crystalline body of a selected material and (b) a melt replenishment device for replenishing the melt in said apparatus, the latter comprising a crucible for containing a melt of said selected material, heating means for heating said crucible and growing means for growing a tubular crystalline body from said melt, said growing means comprising (1) seed holder means for supporting a seed onto which said crystalline body is grown and (2) pulling means for pulling said tubular crystalline body and said seed holder means away from said crucible, said melt replenishment device comprising a container for storing solid silicon particles, and dispenser means coupled with said container for transporting a selected quantity of particles of said selected material from the container to the crucible during a selected time interval upon receipt of an actuation signal, said control system comprising:

weight value generation means for generating an output signal that is representative of the weight of solid silicon particles stored in said container;

length sensor means for generating an output signal that is representative of the length of said growing tubular crystalline body;

weight sensor means for generating an output signal that is representative of the weight of said growing tubular crystalline body, said seed, and said seed holder means;

pressure sensor means for generating an output signal that is representative of the pressure inside said body; and controller means coupled to said weight value generation means, said length sensor means, said weight sensor means, said pressure sensor means, said crucible heating means and said dispenser means for controlling the operation of said crystal growth apparatus and said melt replenishment assembly responsive to the output signals of said weight value generation means, said length sensor means, said weight sensor means, and said pressure sensor means, so as to ensure (a) that said growing crystalline body has a substantially uniform wall thickness and (b) that said selected quantity of silicon particles transported to said crucible will support continuous crystal growth and will not cause unacceptably large thermal excursions in the melt.

11. A system according to claim 10, wherein said controller means comprises means for calculating the true weight of said tubular crystalline body, said calculating means comprising:

means for combining the output signals of said weight sensor means and said pressure sensor means so as to generate a resultant signal that is representative of the true weight of said tubular crystalline body and said seed holder means;

means for generating an offset output signal that is representative of the true weight of said seed holder means; and means for combining said resultant signal and said offset output signal so as to generate a corrected output signal that is representative of the true weight of said tubular crystalline body.

12. A system according to claim 10, wherein said controller means comprises means for calculating the actual wall thickness of said tubular crystalline body at any selected measurement interval, said controller means comprising:

means for providing a desired wall thickness value; and means for comparing said desired wall thickness value with said actual wall thickness and for applying (1) a first signal to said heating means when said desired wall thickness value is less than said actual wall thickness and (2) a second signal to said heating means when said desired wall thickness value is greater than or equal to said actual wall thickness.

13. A system according to claim 10, wherein said controller means comprises (a) means for calculating the change in weight of the silicon particles stored in said container over a selected time interval X as a function of changes in said output signal generated by said scale means over said selected time interval X, (b) means for calculating the change in weight of said tubular crystalline body over said selected time interval X as a function of changes in said corrected output signal over said selected time interval X, and (c) means for adding said change in weight of said silicon particles and said change in weight of said tubular crystalline body so as to produce a resultant change in weight value.

14. A system according to claim 13, wherein said controller comprises:

means for comparing said resultant change in weight value with a zero value and for providing said actuation signal to said dispensing means only when said resultant change in weight value is greater than said zero value.

15. An apparatus for growing a tubular crystalline body of a selected material comprising:

a crucible for containing a melt;

means for heating said crucible;

means for forming a tubular crystalline body from said melt comprising (1) seed holder means for supporting a seed from which said tubular crystalline body is grown and for substantially pneumatically closing off an upper end of said tubular crystalline body and (2) pulling means for pulling said tubular crystalline body, said seed, and said seed holder away from said crucible;

a container for storing solid particles of said selected material;

dispensing means for transporting a selected quantity of said particles stored in said container from said container to the melt in said crucible during a selected time interval upon receipt of an actuation signal;

length measuring means coupled to said forming means for providing an output signal that is representative of the length of said growing tubular crystalline body;

pressure measuring means coupled to said forming means for providing an output signal that is representative of the pressure inside said growing tubular crystalline body acting upwardly against said seed holder;

weight measuring means coupled to said forming means for providing an output signal that is representative of the weight of said growing tubular crystalline body;

weight value generation means coupled to said container for providing an output signal that is representative of the weight of said silicon particles stored in said container;

controller means, coupled to (1) said length measuring means, (2) said pressure measuring means, (3) said weight measuring means, (4) said weight value generation means, (5) said dispensing means and (6) said heating means, for controlling the operation of said dispensing means and said heating means based on the output signals of said length measuring means, said pressure measuring means, said weight measuring means, and said weight value generation means so as to ensure (a) said crystalline body has a substantially uniform wall thickness and (b) said selected quantity of silicon particles transported to said melt will be adequate to support continuous growth of said tubular crystalline body.

16. A control system for controlling the operation of a mechanism for replenishing the melt in an apparatus for growing a tubular crystalline body of a selected material, the apparatus comprising a crucible for containing a melt of silicon, the device comprising a container for storing solid particles of said selected material and dispensing means for transporting a selected quantity of said particles stored in said container from said container to the melt in said crucible during a selected time interval in response to a control signal, the control system comprising:

pressure measuring means coupled to said forming means for providing an output signal that is representative of the pressure inside said growing tubular crystalline body acting upwardly against said seed holder;

weight measuring means coupled to said forming means for providing an output signal that is representative of the weight of said growing tubular crystalline body;

scale means coupled to said container for providing an output signal that is representative of the weight of said particles stored in said container;

controller means coupled to (1) said pressure measuring means, (2) said weight measuring means, (3) said scale means, and (4) said dispensing means, for controlling the operation of said dispensing means based on the output signals of said pressure measuring means, said weight measuring means, and said scale means so as to ensure said selected quantity of said particles transported to said melt will ensure that the level of melt in said crucible remains within predetermined limits during growth of said tubular crystalline body.

* * * * *

UNITED STATES PATENT AND TRADEMARK OFFICE
CERTIFICATE OF CORRECTION

PATENT NO. : 5,085,728
DATED : February 4, 1992
INVENTOR(S) : Brian H. Mackintosh et al It is certified that error appears in the above-identified patent and that said Letters Patent is hereby corrected as shown below:

Claim 5, column 18, line 1, delete the word "silicon".

Signed and Sealed this

Eleventh Day of May, 1993

*Attest:*

MICHAEL K. KIRK

*Attesting Officer*  *Acting Commissioner of Patents and Trademarks*